(12) United States Patent
Lee et al.

(10) Patent No.: US 6,921,622 B2
(45) Date of Patent: Jul. 26, 2005

(54) PHOTORESIST MONOMERS, POLYMERS THEREOF AND PHOTORESIST COMPOSITIONS CONTAINING THE SAME

(75) Inventors: Geun Su Lee, Kyoungki-do (KR); Jae Chang Jung, Kyoungki-do (KR); Ki Soo Shin, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 132 days.

(21) Appl. No.: 10/054,532

(22) Filed: Jan. 22, 2002

(65) Prior Publication Data

US 2003/0022100 A1 Jan. 30, 2003

(30) Foreign Application Priority Data

Jun. 29, 2001 (KR) ........................................ 2001-38118

(51) Int. Cl.⁷ ................................................. G03F 7/20
(52) U.S. Cl. ............................... 430/270.1; 430/286.1; 430/905; 526/281; 526/256; 568/18
(58) Field of Search ........................... 430/270.1, 286.1, 430/905; 526/281, 256, 18

(56) References Cited

U.S. PATENT DOCUMENTS

| | | | |
|---|---|---|---|
| 3,449,302 A | * 6/1969 | Nachbur et al. ............ | 526/256 |
| 4,182,837 A | * 1/1980 | Hergenrother et al. ...... | 528/168 |
| 5,922,518 A | * 7/1999 | Davies et al. ............... | 430/322 |
| 2002/0061464 A1 | * 5/2002 | Aoai et al. ................ | 430/270.1 |

FOREIGN PATENT DOCUMENTS

GB  1057664 A  * 2/1967  ........... C07D/63/08

OTHER PUBLICATIONS

Sigma–Aldrich Product No. B8,450–5 Butadiene Sulfone; www.sigmaaldrich.com.*

"Polymerization of Butadiene Sulfone" Minoura et al. Journal of Polymer Science Part A–1: Polymer Chemistry; vol. 4, Issue 12, pp. 2929–2944 Dec. 1966.*

* cited by examiner

Primary Examiner—Yvette C. Thornton
(74) Attorney, Agent, or Firm—Marshall, Gerstein & Borun LLP

(57) ABSTRACT

Photoresist monomers of following Formula 1, photoresist polymers thereof, and photoresist compositions containing the same. The photoresist polymer includes a repeating unit comprising the photoresist monomer of Formula 1 as a comonomer and the photoresist composition containing the same have excellent etching resistance, heat resistance and adhesiveness to a wafer, and is developable in aqueous tetramethylammonium hydroxide (TMAH) solution. In addition, the photoresist composition has low light absorbance at 157 nm wavelength, and thus is suitable for a photolithography process using ultraviolet light sources such as VUV (157 nm) in fabricating a minute circuit for a high integration semiconductor device Formula 1

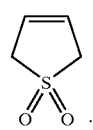

12 Claims, 4 Drawing Sheets

PHOTORESIST MONOMERS, POLYMERS THEREOF AND PHOTORESIST COMPOSITIONS CONTAINING THE SAME

BACKGROUND

1. Technical Field

Novel photoresist monomers, polymers thereof and photoresist compositions containing the same are disclosed. In particular, photoresist monomers are disclosed which are suitable for a photolithography process using DUV (deep ultraviolet) light sources, particularly VUV (vacuum ultraviolet: 157 nm) in fabricating a minute circuit for a high integration semiconductor device, photoresist polymers thereof and photoresist compositions containing the same, and preparation processes are also disclosed.

2. Description of the Related Art

In general, a useful photoresist for ArF and VUV has a variety of desired characteristics, such as low light absorbance at the wavelength of 193 nm and 157 nm, excellent etching resistance, and excellent adhesiveness to a wafer. In addition, a photoresist should be easily developable in a commercially readily available developing solution, such as 2.38 wt % and 2.6 wt % aqueous tetramethylammonium hydroxide (TMAH) solution.

Recently, much research has been conducted on resins having a high transparency at the wavelength of 248 nm and 193 nm and dry etching resistance similar to novolac resin. However, most of the photoresists are not suitable for VUV due to their poor transmittance at 157 nm wavelength.

Research on polyethylene or polyacrylate containing fluorine has also been conducted. Unfortunately, most photoresists containing fluorine with a polyethylene, polystyrene or polyacrylate polymer backbone have weak etching resistance, low solubility in an aqueous TMAH solution and poor adhesiveness to the silicon wafer. In addition, these photoresists are difficult to mass-produce and are expensive.

On the other hand, photoresists containing fluorine with alicyclic polymer or maleicanhydride-norbonene polymer backbone have good adhesiveness to the silicon wafer, low light absorbance at the wavelength of 157 nm and excellent etching resistance compared to photoresists with polyacrylate backbone.

Besides the above photoresist containing a photoresist polymer, which is prepared by using butadiene sulfone instead of maleicanhydride as a comonomer, has a low light absorbance at the wavelength of 157 nm and an excellent etching resistance.

SUMMARY OF THE DISCLOSURE

Accordingly, novel photoresist monomers, polymers thereof and photoresist compositions containing the same are disclosed which can be used for a light sources such as ArF (193 nm) and VUV (157 nm).

Also, a process for forming a photoresist pattern using the photoresist compositions described above and a semiconductor element produced by using the process described above are also disclosed.

DETAILED DESCRIPTION OF THE PRESENTLY PREFERRED EMBODIMENTS

Figure 1:
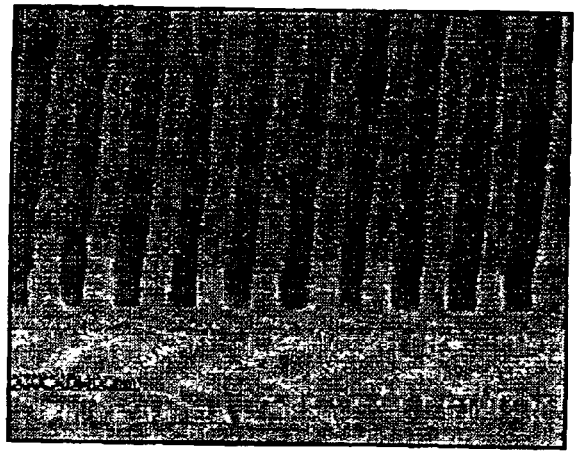
FIG. 1 is a photograph of a photoresist pattern obtained from Example 6.

A butadiene sulfone compound represented by following Formula 1 used for a photoresist monomer:

Formula 1

In addition, a photoresist polymer comprises the compound of Formula 1 as a comonomer. The phororesist polymer comprises a repeating unit represented by following Formula 2 or Formula 3.

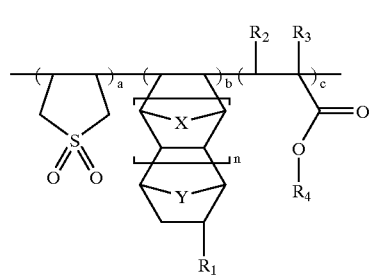

Formula 2

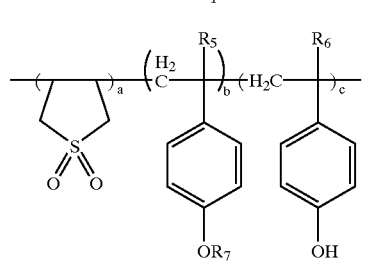

Formula 3 wherein, $R_1$ is selected from the group consisting of H, halogen, ($C_1$–$C_{20}$) alkyl, ($C_1$–$C_{20}$) alkyl with halogen substituent(s), ($C_1$–$C_{20}$) alkyl containing an ether group (—O—), ($C_1$–$C_{20}$) alkyl with halogen substituent(s) and containing an ether group, and —COOR';

$R_2$, $R_3$, $R_5$ and $R_6$ are individually selected from the group consisting of H, halogen, ($C_1$–$C_{20}$) alkyl, ($C_1$–$C_{20}$) alkyl with halogen substituent(s), ($C_1$–$C_{20}$) alkyl containing an ether group, and ($C_1$–$C_{20}$) alkyl with halogen substituent(s) and containing an ether group;

R', $R_4$ and $R_7$ are individually acid labile protecting groups;

X and Y are individually selected from the group consisting of ($C_1$–$C_{10}$) alkylene, O and S;

n is 0 or 1; and the ratio a:b:c falls within the ranges 1–50 mol %: 0–50 mol %: 0–80 mol %.

Preferably, the above repeating unit comprises one or more of substituent(s) which are selected from the group consisting of halogen, ($C_1$–$C_{20}$) alkyl, ($C_1$–$C_{20}$) alkyl with halogen substituent(s), ($C_1$–$C_{20}$) alkyl containing an ether group, and ($C_1$–$C_{20}$) alkyl with halogen substituent(s) and containing an ether group. More preferably, they comprise one or more of substituent(s) which are selected from the group consisting of F, ($C_1$–$C_{20}$) alkyl, ($C_1$–$C_{20}$) perfluoroalkyl, ($C_1$–$C_{20}$) alkyl containing an ether group, ($C_1$–$C_{20}$) perfluoroalkyl containing an ether group, ($C_1$–$C_{20}$) alkyl partially substituted with F, and ($C_1$–$C_{20}$) alkyl partially substituted with F and containing an ether group.

In an embodiment, $R_2$, $R_3$, $R_5$ and $R_6$ are individually selected from the group consisting of H, F, $CH_3$ and $CF_3$.

And the acid labile protecting group can be any of known protective groups which prevent the compound from dissolving in an alkaline developing solution. However, under the presence of acid, the acid labile group is substituted with acid, thereby making the compound soluble to the alkaline solution.

Some of conventional acid labile protecting groups are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Acid labile protecting groups of the present invention are preferably selected from the group consisting of 2-methyl 2-adamantyl, hexafluoro isopropyl, 8-ethyl 8-tricyclodecanyl, tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl and 2-acetylmenth-1-yl.

The above repeating unit of Formula 2 or Formula 3 further comprise the following monomer of Formula 4.

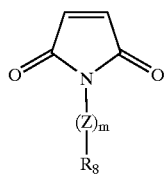

Formula 4 wherein, $R_8$ is selected from the group consisting of H, halogen, ($C_1$–$C_{20}$) alkyl, ($C_1$–$C_{20}$) alkyl with halogen substituent(s), ($C_1$–$C_{20}$) alkyl containing an ether group, and ($C_1$–$C_{20}$) alkyl with halogen substituent(s) and containing an ether group;

Z is O or S; and m is 0 or 1.

Some of preferred repeating units of above Formula 2 are disclosed, but are not limited to, as following Formulas 2a to 2e:

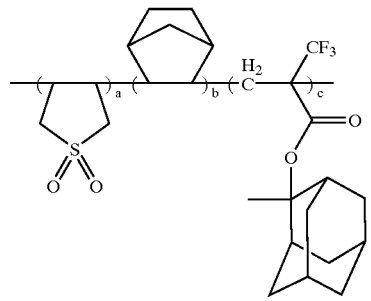

Formula 2a

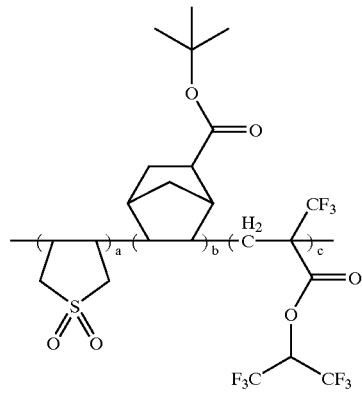

Formula 2b

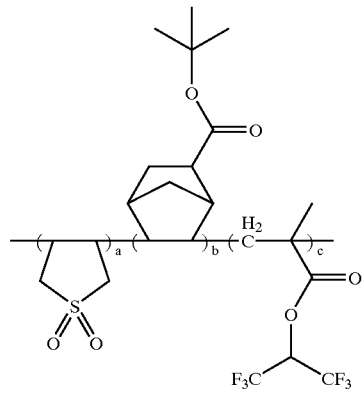

Formula 2c

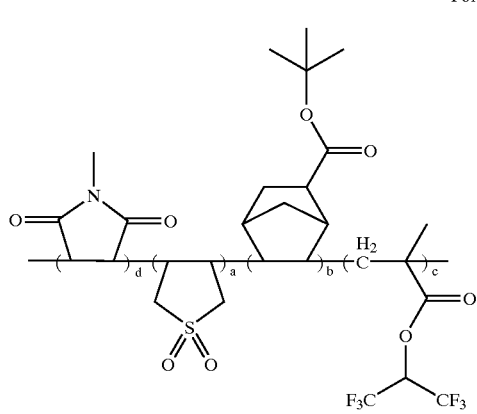

Formula 2d

Some of preferred repeating units of above Formula 3 are disclosed, but are not limited to, as following Formula 3a:

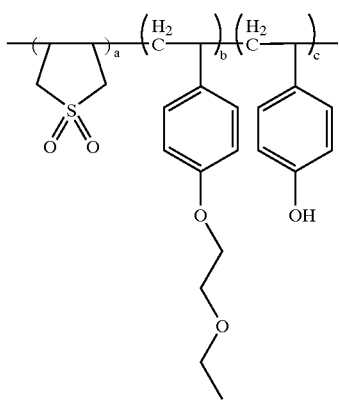

Formula 3a

The process for preparing of a photoresist polymer comprising the repeating units of Formula 2 or Formula 3 will now be explained in more detail. Radical polymerizing or anion polymerizing each comonomer can prepare the disclosed repeating unit. For example, the repeating unit of Formula 2 can be prepared according to the process comprising:

(a) admixing (i) a monomer of Formula 1, (ii) at least one of the monomer selected from the group consisting of Formula 5 and Formula 6, and optionally (iii) a monomer of Formula 4; and (b) adding a radical polymerization initiator into the resultant of step (a) in case of performing radical polymerization; or adding an anion polymerization catalyst into the resultant of step (a) in case of performing anion polymerization.

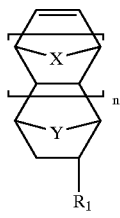

Formula 5

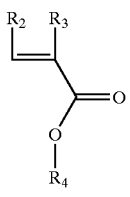

Formula 6 wherein, $R_1$ is selected from the group consisting of H, halogen, $(C_1-C_{20})$ alkyl, $(C_1-C_{20})$ alkyl with halogen substituent(s), $(C_1-C_{20})$ alkyl containing an ether group, $(C_1-C_{20})$ alkyl with halogen substituent(s) and containing an ether group, and —COOR';

$R_2$ and $R_3$ are individually selected from the group consisting of H, halogen, $(C_1-C_{20})$ alkyl, $(C_1-C_{20})$ alkyl with halogen substituent(s), $(C_1-C_{20})$ alkyl containing an ether group, and $(C_1-C_{20})$ alkyl with halogen substituent(s) and containing an ether group;

R' and $R_4$ are individually acid labile protecting groups;

X and Y are individually selected from the group consisting of $(C_1-C_{10})$ alkylene, O and S; and n is 0 or 1.

In addition the repeating unit of Formula 3 can be prepared according to the process comprising:

(a) admixing (i) a monomer of Formula 1, (ii) at least one of the monomer selected from the group consisting of Formula 7 and Formula 8, and optionally (iii) a monomer of Formula 4; and (b) adding a radical polymerization initiator into the resultant of step (a) in case of performing radical polymerization; or adding an anion polymerization catalyst into the resultant of step (a) in case of performing anion polymerization.

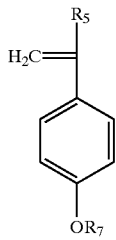

Formula 7

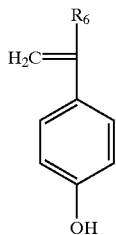

Formula 8 wherein, $R_5$ and $R_6$ are individually selected from the group consisting of H, halogen, $(C_1-C_{20})$ alkyl, $(C_1-C_{20})$ alkyl with halogen substituent(s), $(C_1-C_{20})$ alkyl containing an ether group, and $(C_1-C_{20})$ alkyl with halogen substituent(s) and containing an ether group; and $R_7$ is an acid labile protecting group.

The repeating unit of Formula 3 can be prepared according to the following process as well as polymerizing each comonomer as described above. For example, in case that the repeating unit of Formula 3 only comprises monomers of Formula 1, Formula 7 and Formula 8, the process comprises:

(a) polymerizing a monomer of Formula 1 and 4-acetoxy styrene derivative by radical polymerization or anion polymerization;

(b) hydrolyzing the resultant polymer of step (a) to obtain a polymer of 4-hydroxy styrene monomer of the Formula 8; and (c) reacting a compound containing acid labile protecting group ($R_7$) with the resultant of step (b) thereby substituting partial hydrogens of hydroxyl group with acid labile protecting group.

In the above process, radical polymerization or anion polymerization are carried out by bulk polymerization or solution polymerization.

In case that it is carried out by solution polymerization, the organic solvents suitable for polymerization can be cyclohexanone, cyclopentanone, tetrahydrofuran, dimethylformamide, dimethylsulfoxide, dioxane, methylethylketone, benzene, toluene, xylene or mixtures thereof.

The polymerization initiators can be any conventional one, preferably a radical polymerization initiators such as 2,2'-azobisisobutyronitrile (AIBN), benzoyl peroxide, acetyl peroxide, lauryl peroxide, tert-butyl peracetate or di-tert-butyl peroxide.

And the anion polymerization catalyst can be selected from the group consisting of KOH, $NaNH_2$, alkoxide ion, alkali metal, grignard reagent, and alkyl lithium such as lithium diisopropyl amide or n-BuLi.

More preferably, after polymerization, the repeating unit is subject to crystallization and/or purification by using diethyl ether, petroleum ether, alkane, alcohol, water or mixtures thereof.

A photoresist polymer of the present invention comprises the above repeating unit in the main chain and further comprises other comonomers or additives as occasion demands.

In addition, another aspect of the present invention provides a photoresist composition comprising (i) a photoresist polymer described above; (ii) a photoacid generator; and (iii) an organic solvent.

Any of conventional photoacid generator, which is able to generate acids when it is exposed to light, can be used. Some of conventional photoacid generator are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001).

Preferred photoacid generators have relatively low light absorbance in the wavelength of 157 nm and 193 nm. More preferred photoacid generator is phthalimidotrifluoromethane sulfonate, dinitrobenzyltosylate, n-decyl disulfone, naphthylimido trifluoromethane sulfonate or mixtures thereof.

The photoacid generator can further comprise a compound selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-tert-butylphenylsulfonium triflate, triphenylsulfonium hexafluoroarsenate, triphenylsulfonium hexafluoroantimonate, triphenylsulfonium triflate, dibutyl-naphthylsulfonium triflate and mixtures thereof.

Typically, the amount of photoacid generator is from about 0.05 to about 10% by weight of the photoresist polymer employed. It has been found that when the photoacid generator is used in the amount less than about 0.05%, it lowers photosensitivity of the photoresist composition, and when the photoacid generator is used in the amount greater than about 10%, it results in a poor pattern formation due to its high absorption.

On the other hand, any of conventional organic solvent can be employed for this invention and some of the conventional one are also disclosed in the documents described above. Preferred organic solvents for photoresist composition is methyl 3-methoxypropionate, ethyl 3-ethoxypropionate, propylene glycol methyl ether acetate, cyclohexanone, 2-heptanone, ethyl lactate or mixture thereof.

The amount of organic solvent can range from about 500 to about 2000% by weight of the photoresist polymer to coat the photoresist in a wanted thickness. It has been found that when the organic solvent is used in the amount of about 1000 wt %, a thickness of the photoresist will be about 0.25 $\mu$m.

The present invention also provides a process for forming a photoresist pattern comprising:

(a) coating the photoresist composition described above on a substrate to form a photoresist film;

(b) exposing the photoresist film to light; and (c) developing the exposed photoresist film to obtain a photoresist pattern.

The process for forming the photoresist pattern can further include a soft baking which is preformed before the step (b) and/or a post baking step which is preformed after the step (b). Preferably, the soft and post baking steps are performed at temperature ranging from about 70 to about 200° C.

Exemplary light sources which are useful for forming the photoresist pattern include not only VUV but also ArF, KrF, E-beam, EUV or ion beam. Preferably, the irradiation energy in the step (b) is in the range of between about 1 $mJ/cm^2$ and about 100 $mJ/cm^2$.

On the other hand, the step (c) can be performed in alkaline developing solution, which is preferably TMAH aqueous solution with a concentration ranging from about 0.01 to about 5 wt %.

In addition, another aspect of the present invention provides a semiconductor device manufactured using the photoresist composition described above.

The disclosed polymers and photoresist compositions will now be described in more detail by referring to examples below, which are not intended to be limiting.

I. Preparation of Photoresist Polymers

EXAMPLE 1

Synthesis of poly(butadiene sulfone/norbonen/2-methyl 2-adamantyl trifluoromethyl acrylate)

To 20 mL of anhydrous tetrahydrofuran was added butadiene sulfone (0.1 mole), norbonene (0.1 mole), 2-methyl 2-adamantyl trifluoromethyl acrylate (0.1 mole) and AIBN (0.3 g), and the resulting solution was reacted at about 65° C. for about 10 hours. Thereafter, a polymer was precipitated and filtered in mixture solution of methanol and water, thereby obtaining the entitled polymer of Formula 2a (yield: 67%).

EXAMPLE 2

Synthesis of poly(butadiene sulfone/tert-butyl-5-norbonene-2-carboxylate/hexafluoroisopropyl trifluoromethyl acrylate)

To 25 mL of tetrahydrofuran was added butadiene sulfone (0.1 mole), tert-butyl-5-norbonene-2-carboxylate (0.1 mole), hexafluoroisopropyl trifluoromethyl acrylate (0.1 mole) and AIBN (0.5 g), and the resulting solution was reacted at about 65° C. for about 10 hours. Thereafter, a polymer was precipitated and filtered in mixture solution of methanol and water, thereby obtaining the entitled polymer of Formula 2b (yield: 56%).

EXAMPLE 3

Synthesis of poly(butadiene sulfone/tert-butyl-5-norbonene-2-carboxylate/hexafluoroisopropyl methacrylate)

To 25 mL of tetrahydrofuran was added butadiene sulfone (0.1 mole), tert-butyl-5-norbonene-2-carboxylate (0.1 mole), hexafluoroisopropyl methacrylate (0.1 mole) and AIBN (0.5 g), and the resulting solution was reacted at about 65° C. for about 10 hours. Thereafter, a polymer was precipitated and filtered in mixture solution of methanol and water, thereby obtaining the entitled polymer of Formula 2c (yield: 56%).

EXAMPLE 4

Synthesis of poly(methyl maleimide/butadiene sulfone/tert-butyl-5-norbonene-2-carboxylate/ hexafluoroisopropyl methacrylate)

To 25 mL of tetrahydrofuran was added methyl maleimide (50 mL), butadiene sulfone (0.1 mole), tert-butyl-5-norbonene-2-carboxylate (0.1 mole), hexafluoroisopropyl methacrylate (0.1 mole) and AIBN (0.5 g), and the resulting solution was reacted at about 65° C. for about 10 hours. Thereafter, a polymer was precipitated and filtered in mixture solution of methanol and water, thereby obtaining the entitled polymer of Formula 2d (yield: 56%).

EXAMPLE 5

Synthesis of poly(butadiene sulfone/4-ethoxyethoxy styrene/4-hydroxy styrene (Stage 1) Synthesis of poly(butadiene sulfone/4-acetoxy styrene)

To 20 mL of anhydrous tetrahydrofuran was added butadiene sulfone (0.1 mole), 4-acetoxy styrene (0.15 mole) and AIBN (0.3 g), and was passed through nitrogen thereby removing general air. And the resulting solution was shielded thoroughly and reacted at about 90° C. for about 10 hours. Thereafter, a polymer was precipitated and filtered in mixture solution of methanol and water, thereby obtaining the entitled compound (yield: 56%).

(Stage 2) Synthesis of poly(butadiene sulfone/4-hydroxy styrene)

To mixture solution which is 20 mL of methanol and 30 mL of 1N hydrochloric acid was added poly(butadiene sulfone/4-acetoxy styrene) obtained from Stage 1(0.05 mole). And the resulting solution was reacted at about 50° C. for about 10 hours, thereby obtaining the entitled compound (yield: 95%).

(Stage 3) Synthesis of poly(butadiene sulfone/4-ethoxyethoxy styrene/4-hydroxy styrene)

To 10 mL of tetrahydrofuran was added poly(butadiene sulfone/4-hydroxy styrene) obtained from Stage 2(0.04 mole) and sulfuric acid (0.1 mL), and the resulting solution was stirred at room temperature for about 10 minutes. And then ethylvinylether was injected a reactor containing the resulting solution and stirred for about 10 hours. Thereafter, a polymer was precipitated and filtered in mixture solution of methanol and water, thereby obtaining the entitled compound substituted partial hydrogens of hydroxyl group with ethoxyethyl which is acid labile protecting group (yield: 92%).

II. Preparation of Photoresist Compositions and Formation of Patterns

EXAMPLE 6

Preparation of Photoresist Compositions and Formation of Patterns (1)

To 100 g of propylene glycol methyl ether acetate (PGMEA) was added 10 g of the photoresist polymer obtained from Example 1, 0.06 g of phthalimidotrifluoromethane sulfonate, and 0.06 g of triphenylsulfonium triflate. The polymer was precipitated and filtered in 0.20 μm filter to obtain a photoresist composition.

The photoresist composition thus prepared was spin-coated on silicon wafer to form a photoresist film, and soft-baked at about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.12 μm L/S pattern (see FIG. 1).

EXAMPLE 7

Preparation of Photoresist Compositions and Formation of Patterns (2)

To 100 g of propylene glycol methyl ether acetate (PGMEA) was added 10 g of the photoresist polymer obtained from Example 2, 0.06 g of phthalimidotrifluoromethane sulfonate, and 0.06 g of triphenylsulfonium triflate. The polymer was precipitated and filtered in 0.20 μm filter to obtain a photoresist composition.

Figure 2:
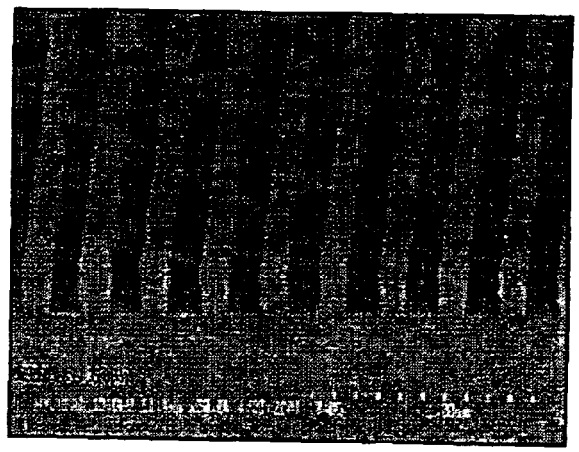
FIG. 2 is a photograph of a photoresist pattern obtained from Example 7.

The photoresist composition thus prepared was spin-coated on silicon wafer to form a photoresist film, and soft-baked at about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.13 μm L/S pattern (see FIG. 2).

EXAMPLE 8

Preparation of Photoresist Compositions and Formation of Patterns (3)

To 100 g of propylene glycol methyl ether acetate (PGMEA) was added 10 g of the photoresist polymer obtained from Example 3, 0.06 g of phthalimidotrifluoromethane sulfonate, and 0.06 g of triphenylsulfonium triflate. The polymer was precipitated and filtered in 0.20 μm filter to obtain a photoresist composition.

Figure 3:
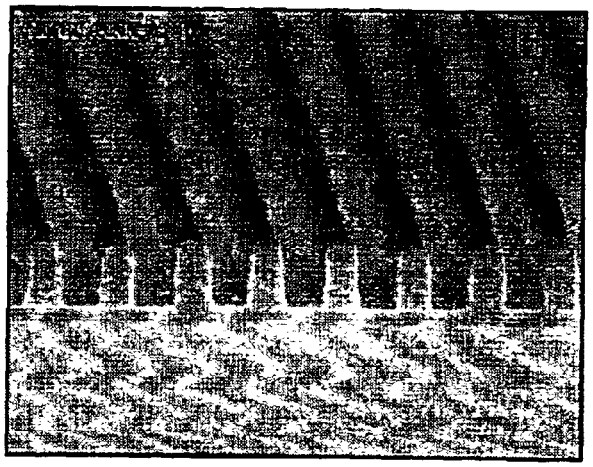
FIG. 3 is a photograph of a photoresist pattern obtained from Example 8.

The photoresist composition thus prepared was spin-coated on silicon wafer to form a photoresist film, and soft-baked at about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.12 μm L/S pattern (see FIG. 3).

EXAMPLE 9

Preparation of Photoresist Compositions and Formation of Patterns (4)

To 100 g of propylene glycol methyl ether acetate (PGMEA) was added 10 g of the photoresist polymer obtained from Example 4, 0.06 g of phthalimidotrifluoromethane sulfonate, and 0.06 g of triphenylsulfonium triflate. The polymer was precipitated and filtered in 0.20 μm filter to obtain a photoresist composition.

Figure 4:
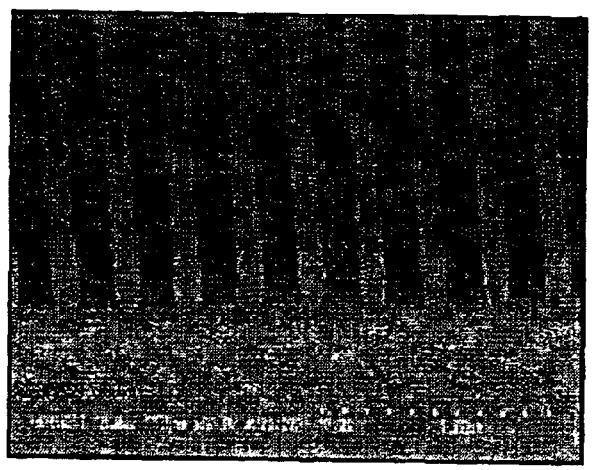
FIG. 4 is a photograph of a photoresist pattern obtained from Example 9.

The photoresist composition thus prepared was spin-coated on silicon wafer to form a photoresist film, and soft-baked at about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.13 μm L/S pattern (see FIG. 4).

EXAMPLE 10

Preparation of Photoresist Compositions and Formation of Patterns (5)

To 100 g of propylene glycol methyl ether acetate (PGMEA) was added 10 g of the photoresist polymer obtained from Example 5, 0.06 g of phthalimidotrifluoromethane sulfonate, and 0.06 g of triphenylsulfonium triflate. The polymer was precipitated and filtered in 0.20 μm filter to obtain a photoresist composition.

Figure 5:
FIG. 5 is a photograph of a photoresist pattern obtained from Example 10.

The photoresist composition thus prepared was spin-coated on silicon wafer to form a photoresist film, and soft-baked at about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.13 μm L/S pattern (see FIG. 5).

EXPERIMENTAL EXAMPLE

Examination of Absorbance at 157 nm

Figure 6:
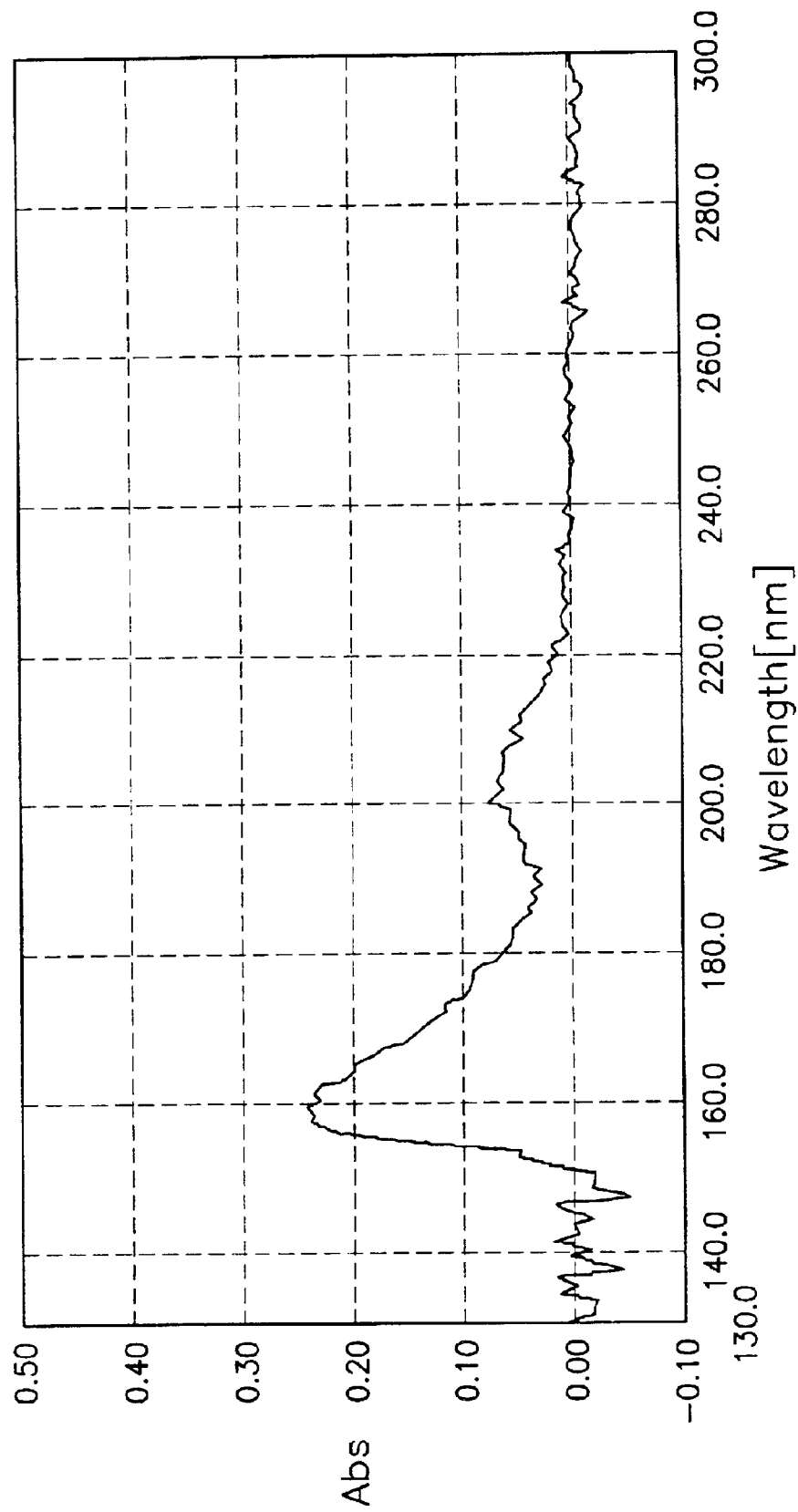
FIG. 6 is a VUV spectrum for a photoresist composition obtained from Example 6.

Absorbance of photoresist composition obtained from Example 6 coated in a thickness of 2500 Å was shown by VUV spectrum of FIG. 6. According to FIG. 6, the absorbance of the photoresist composition of Example 6 at 157 nm wavelength was 0.25, which was merely a half of the absorbance of conventional photoresist for KrF or ArF light source at 157 nm. Thus, the conventional photoresist composition should be coated in a thickness of 600~700 Å or less to satisfy the requisite of light transmittance for a lithography process employing 157 nm light source, while the photoresist composition according to the present invention, having high light transmittance for 157 nm light source, can provide efficient pattern even when it coated in a thickness of 1200 Å or more.

The photoresist composition according to the present invention ensures enhanced etching resistance, as it allows formation of photoresist film in a sufficient thickness.

From Experimental Example, it is noticed that the composition comprising the photoresist polymer according to the present invention has excellent light transmittance at 157 nm wavelength, so that it can be usefully employed for a photolithography process using 157 nm light source. In addition, from Examples 6 to 10, it is ascertained that the photoresist composition comprising the photoresist polymer according to the present invention has effective physical property as a photoresist.

As discussed earlier, a photoresist pattern having excellent durability, etching resistance, and developable property can be formed successfully by employing the photoresist composition of this present invention. And the photoresist composition of this present invention can be used in forming a minute pattern below 1 G DRAM as well as 4 G and 16 G. Moreover, the photoresist polymer of this present invention has a low light absorbance at the 157 nm wavelength, and thus is suitable for a photolithography using VUV.

What is claimed is:

1. A photoresist composition comprising:
    (i) a photoresist polymer comprising a repeating unit selected from the group consisting of Formulas 2 and 3:

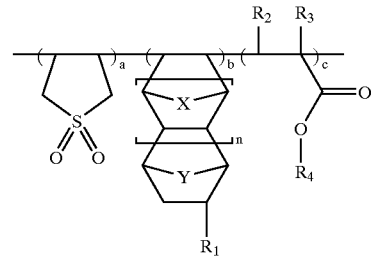

Formula 2

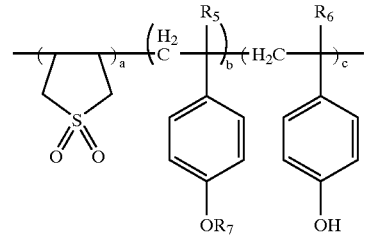

Formula 3 wherein $R_1$ is selected from the group consisting of H, halogen, $(C_1-C_{20})$ alkyl, $(C_1-C_{20})$ alkyl with halogen substituent(s), $(C_1-C_{20})$ alkyl containing an ether group (—O—), $(C_1-C_{20})$ alkyl with halogen substituent(s) and containing an ether group, and —COOR';

$R_2$, $R_3$, $R_5$ and $R_6$ are individually selected from the group consisting of H, halogen, $(C_1-C_{20})$ alkyl, $(C_1-C_{20})$ alkyl with halogen substituent(s), $(C_1-C_{20})$ alkyl containing an ether group, and $(C_1-C_{20})$ alkyl with halogen substituent(s) and containing an ether group;

R', $R_4$ and $R_7$ are individually acid labile protecting groups;

X and Y are individually selected from the group consisting of $(C_1-C_{10})$ alkylene, O and S;

n is 0 or 1; and the ratio a:b:c falls within the ranges 1–50 mol %: 0–50 mol %: 0–80 mol %, wherein at least one of b and c must be present;

(ii) an organic solvent; and (iii) a photoacid generator.

2. The photoresist composition according to claim 1, wherein the photoacid generator is selected from the group consisting of phthalimidotrifluoromethane sulfonate, dinitrobenzyltosylate, n-decyl disulfone and naphthylimido trifluoromethane sulfonate.

3. The photoresist composition according to claim 2, wherein the photoacid generator further comprises a compound selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-tert-butylphenylsulfonium triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate and mixtures thereof.

4. The photoresist composition according to claim 1, wherein the photoacid generator is present in an amount ranging from about 0.05 to about 10% by weight of the photoresist polymer.

5. The photoresist composition according to claim 1, wherein the organic solvent is selected from the group consisting of methyl 3-methoxypropionate, ethyl 3-ethoxypropionate, propylene glycol methyl ether acetate, cyclohexanone, 2-heptanone, ethyl lactate and mixtures thereof.

6. The photoresist composition according to claim 1, wherein the organic solvent is present in an amount ranging from about 500 to about 2000% by weight of the photoresist polymer.

7. A photoresist polymer comprising a repeating unit selected from the group consisting of Formula 2 and Formula 3:

Formula 2

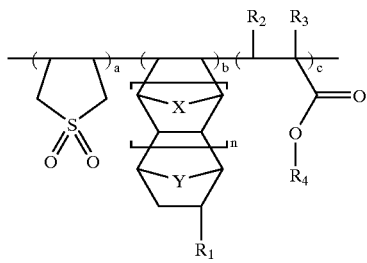

Formula 3

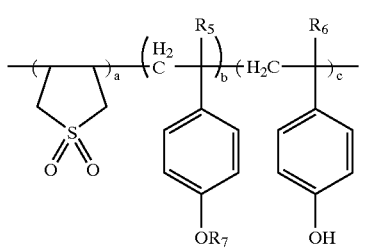

wherein $R_1$ is selected from the group consisting of H, halogen, $(C_1-C_{20})$ alkyl, $(C_1-C_{20})$ alkyl with halogen substituent(s), $(C_1-C_{20})$ alkyl containing an ether group (—O—), $(C_1-C_{20})$ alkyl with halogen substituent(s) and containing an ether group, and —COOR';

$R_2$, $R_3$, $R_5$ and $R_6$ are individually selected from the group consisting of H, halogen, $(C_1-C_{20})$ alkyl, $(C_1-C_{20})$ alkyl with halogen substituent(s), $(C_1-C_{20})$ alkyl containing an ether group, and $(C_1-C_{20})$ alkyl with halogen substituent(s) and containing an ether group;

R', $R_4$ and $R_7$ are individually acid labile protecting groups;

X and Y are individually selected from the group consisting of $(C_1-C_{10})$ alkylene, O and S;

n is 0 or 1;

the ratio a:b:c falls within the ranges 1–50 mol %: 0–50 mol %: 0–80 mol %, wherein if the repeating unit is Formula 2, b must be present.

8. The photoresist polymer according to claim 7, wherein the repeating unit comprises one or more of substituent(s) which are selected from the group consisting of halogen, $(C_1-C_{20})$ alkyl, $(C_1-C_{20})$ alkyl with halogen substituent(s), $(C_1-C_{20})$ alkyl containing an ether group, and $(C_1-C_{20})$ alkyl with halogen substituent(s) and containing an ether group.

9. The photoresist polymer according to claim 7, wherein the acid labile protecting group is selected from the group consisting of 2-methyl 2-adamantyl, hexafluoro isopropyl, 8-ethyl 8-tricyclodecanyl, tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl and 2-acetylmenth-1-yl.

10. The photoresist polymer according to claim 7, wherein the repeating unit further comprises a monomer of Formula 4.

Formula 4

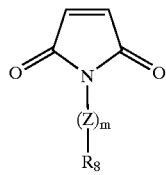

wherein, $R_8$ is selected from the group consisting of H, halogen, $(C_1-C_{20})$ alkyl, $(C_1-C_{20})$ alkyl with halogen substituent(s), $(C_1-C_{20})$ alkyl containing an ether group, and $(C_1-C_{20})$ alkyl with halogen substituent(s) and containing an ether group;

Z is O or S; and m is 0 or 1.

11. The photoresist polymer according to claim 7, wherein the repeating unit is represented by Formulas 2a to 2d or Formula 3a:

Formula 2a

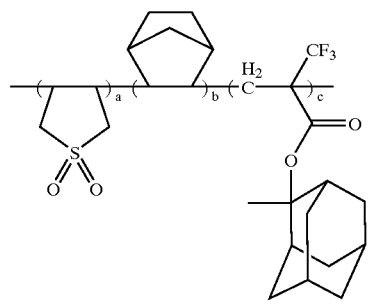

Formula 2b

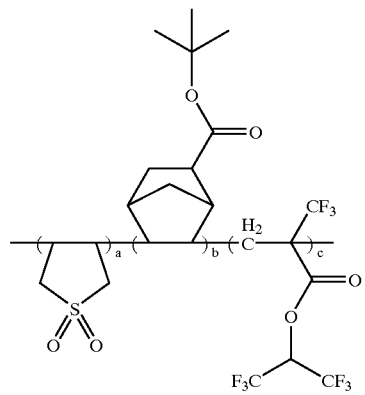

Formula 2c

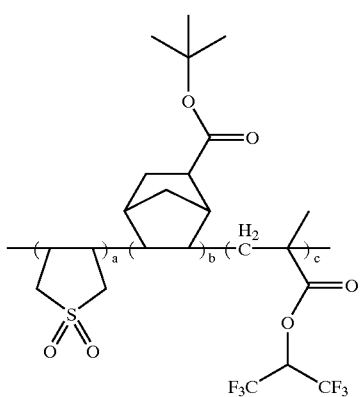

Formula 2d

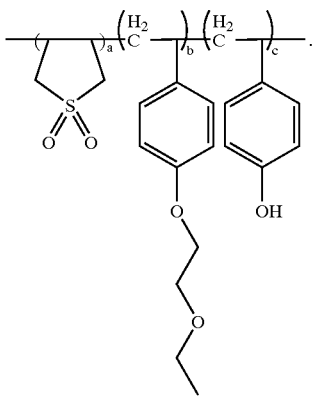

Formula 3a

12. A photoresist polymer comprising a repeating unit selected from the group consisting of Formula 2 and Formula 3:

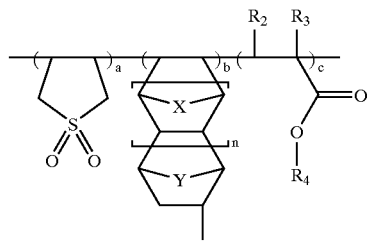

Formula 2

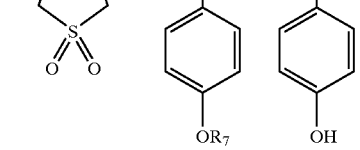

Formula 3 wherein $R_1$ is selected from the group consisting of H, halogen, $(C_1-C_{20})$ alkyl, $(C_1-C_{20})$ alkyl with halogen substituent(s), $(C_1-C_{20})$ alkyl containing an ether group (—O—), $(C_1-C_{20})$ alkyl with halogen substituent(s) and containing an ether group, and —COOR';

$R_2$, $R_3$, $R_5$ and $R_6$ are individually selected from the group consisting of H, halogen, $(C_1-C_{20})$ alkyl, $(C_1-C_{20})$ alkyl with halogen substituent(s), $(C_1-C_{20})$ alkyl containing an ether group, and $(C_1-C_{20})$ alkyl with halogen substituent(s) and containing an ether group;

R', $R_4$ and $R_7$ are individually acid labile protecting groups;

X and Y are individually selected from the group consisting of $(C_1-C_{10})$ alkylene, O and S;

n is 0 or 1; and the ratio a:b:c falls within the ranges 1–50 mol %: present in an amount up to and including 50 mol %: present in an amount up to and including 80 mol % and wherein if the repeating unit is Formula 2, b must be present.

* * * * *

UNITED STATES PATENT AND TRADEMARK OFFICE
CERTIFICATE OF CORRECTION

PATENT NO. : 6,921,622 B2  
APPLICATION NO. : 10/054532  
DATED : July 26, 2005  
INVENTOR(S) : Geun Su Lee et al.

It is certified that error appears in the above-identified patent and that said Letters Patent is hereby corrected as shown below:

Title Page, Column One, Field (73) Assignee
Please delete "Kyoungki-Do" and insert -- Kyoungki-do -- in its place.

Title Page, Column Two, Field (57) Abstract, Line 10
Please delete "157 mn" and insert -- 157mn -- in its place.

Title Page, Column Two, Field (57) Abstract, Line 11
Please delete "(157 mn)" and insert -- (157mn) -- in its place.

Title Page, Column Two, Field (57) Abstract, Line 12
Please delete "device" and insert -- device. -- in its place.

Title Page, Column Two, Field (57) Abstract, Figure of Formula 1
Please delete                    and insert "Formula 1"            -- Formula 1 --            in its place.

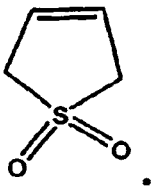   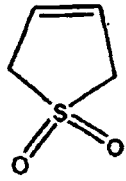

UNITED STATES PATENT AND TRADEMARK OFFICE
CERTIFICATE OF CORRECTION

PATENT NO. : 6,921,622 B2
APPLICATION NO. : 10/054532
DATED : July 26, 2005
INVENTOR(S) : Geun Su Lee et al.

It is certified that error appears in the above-identified patent and that said Letters Patent is hereby corrected as shown below:

Column 12, Lines 39-40
After "within the ranges" please delete "1-50 mol %: 0-50 mol %: 0-80 mol %,"
and insert -- 1-50mol% : 0-50mol% : 0-80mol%, -- in its place.

Column 13, Lines 56-57
After "within the ranges" please delete "1-50 mol %: 0-50 mol %: 0-80 mol %,"
and insert -- 1-50mol% : 0-50mol% : 0-80mol%, -- in its place.

Column 16, Line 46
After "within the ranges" please delete "1-50 mol %:"
and insert -- 1-50mol%: -- in its place.

Column 16, Line 47
After "including" please delete "50 mol %:"
and insert -- 50mol%: -- in its place.

Column 16, Line 48
After "including" please delete "80 mol %"
and insert -- 80mol% -- in its place.

Signed and Sealed this

Seventeenth Day of October, 2006

JON W. DUDAS
*Director of the United States Patent and Trademark Office*